US009627845B2

(12) United States Patent
Hiroi et al.

(10) Patent No.: US 9,627,845 B2
(45) Date of Patent: Apr. 18, 2017

(54) METHOD FOR MANUFACTURING AN OPTICAL UNIT

(71) Applicants: Masaki Hiroi, Miyagi (JP); Satoru Sugawara, Miyagi (JP)

(72) Inventors: Masaki Hiroi, Miyagi (JP); Satoru Sugawara, Miyagi (JP)

(73) Assignee: RICOH COMPANY, LTD., Tokyo (JP)

( * ) Notice: Subject to any disclaimer, the term of this patent is extended or adjusted under 35 U.S.C. 154(b) by 496 days.

(21) Appl. No.: 13/719,709

(22) Filed: Dec. 19, 2012

(65) Prior Publication Data

US 2013/0152366 A1    Jun. 20, 2013

(30) Foreign Application Priority Data

Dec. 20, 2011 (JP) .................................. 2011-277820

(51) Int. Cl.
*H01S 5/022*     (2006.01)
*B41J 2/455*     (2006.01)
(Continued)

(52) U.S. Cl.
CPC ............... *H01S 5/022* (2013.01); *B41J 2/455* (2013.01); *B41J 2/473* (2013.01);
(Continued)

(58) Field of Classification Search
CPC ............. Y10T 29/4913; Y10T 29/4931; Y10T 29/49144; Y10T 29/49826; H01S 5/022; H05K 3/3457
(Continued)

(56) References Cited

U.S. PATENT DOCUMENTS 5,912,872 A * 6/1999 Feldman ................. G11B 7/123
369/103
5,995,474 A * 11/1999 Shimano ................. B82Y 20/00
369/13.32
(Continued)

FOREIGN PATENT DOCUMENTS

JP    61-59368      4/1986
JP    61-218186     9/1986
(Continued)

OTHER PUBLICATIONS

Japanese official action dated Sep. 1, 2015 in corresponding Japanese Patent Application No. 2011-277820.

*Primary Examiner* — A. Dexter Tugbang
*Assistant Examiner* — Kaying Kue
(74) *Attorney, Agent, or Firm* — Cooper & Dunham LLP

(57) ABSTRACT

Disclosed is a method for manufacturing an optical unit, including a step of bringing two side face portions of a ceramic package into contact with two contact portions of a jig, a step of placing plural light-receiving and light-emitting elements in a predetermined region of the ceramic package with reference to the contact portions of the jig, and a step of connecting the plural light-receiving and light-emitting elements to a wiring line part formed in the ceramic package by using a bonding wire, wherein at least one of the plural light-receiving and light-emitting elements is placed between one of the two contact portions of the jig and another one of the plural light-receiving and light-emitting elements in the step of placing the plural light-receiving and light-emitting elements.

6 Claims, 30 Drawing Sheets

(51) Int. Cl.
  *B41J 2/47* (2006.01)
  *H01S 5/0683* (2006.01)
  *H01S 5/183* (2006.01)

(52) U.S. Cl.
  CPC ...... *H01S 5/02276* (2013.01); *H01S 5/02296* (2013.01); *H01L 2224/48091* (2013.01); *H01L 2224/49171* (2013.01); *H01L 2224/78301* (2013.01); *H01L 2224/85181* (2013.01); *H01S 5/02248* (2013.01); *H01S 5/02252* (2013.01); *H01S 5/0683* (2013.01); *H01S 5/183* (2013.01); *Y10T 29/49826* (2015.01)

(58) Field of Classification Search
  USPC .................................. 29/832–841, 739–741
  See application file for complete search history.

(56) References Cited

U.S. PATENT DOCUMENTS

| | | | | |
|---|---|---|---|---|
| 6,061,371 A * | 5/2000 | Uejima | B41J 2/473 | 372/109 |
| 6,267,515 B1 * | 7/2001 | Okuda | G02B 6/4206 | 385/88 |
| 6,453,096 B1 * | 9/2002 | Kim | G02B 6/423 | 385/24 |
| 7,021,835 B1 * | 4/2006 | Vandenberg | G02B 6/4201 | 385/38 |
| 7,281,860 B2 * | 10/2007 | Fujita | H01L 33/60 | 257/98 |
| 7,364,367 B2 * | 4/2008 | Nagai | G02B 6/4224 | 385/88 |
| 7,655,540 B2 * | 2/2010 | Chang | H01L 21/67333 | 257/E21.238 |
| 7,978,739 B2 | 7/2011 | Sugawara et al. | | |
| 8,111,725 B2 | 2/2012 | Ishii et al. | | |
| 8,220,973 B2 * | 7/2012 | Engl | H01L 33/483 | 362/317 |
| 8,369,709 B2 * | 2/2013 | Guo | H01S 5/4025 | 385/92 |
| 8,421,838 B2 * | 4/2013 | Yamaguchi | B41J 2/471 | 257/710 |
| 8,492,175 B1 * | 7/2013 | Fanfelle | G01R 31/2635 | 257/E21.525 |
| 8,633,643 B2 * | 1/2014 | Lee | F21S 48/1159 | 257/99 |
| 8,703,511 B2 * | 4/2014 | Matoba | H01L 33/486 | 257/99 |
| 8,803,936 B2 * | 8/2014 | Adachi | B82Y 20/00 | 347/130 |
| 9,296,111 B2 * | 3/2016 | Bibl | B25J 15/0085 | |
| 2001/0023920 A1 * | 9/2001 | Ando | G02B 6/4201 | 250/227.11 |
| 2003/0053501 A1 | 3/2003 | Sekiya et al. | | |
| 2004/0264837 A1 * | 12/2004 | Ogawa | G02B 6/42 | 385/14 |
| 2005/0013562 A1 * | 1/2005 | Tatehata | G02B 6/4201 | 385/93 |
| 2005/0141822 A1 * | 6/2005 | Nagai | G02B 6/4239 | 385/88 |
| 2006/0092642 A1 * | 5/2006 | Nakata | G11B 7/127 | 362/294 |
| 2007/0058232 A1 | 3/2007 | Nakajima | | |
| 2008/0185603 A1 * | 8/2008 | Itoi | A61B 1/05 | 257/98 |
| 2009/0056111 A1 * | 3/2009 | Muren | H05K 3/303 | 29/739 |
| 2009/0295902 A1 | 12/2009 | Sato et al. | | |
| 2010/0213471 A1 * | 8/2010 | Fukasawa | H01L 24/34 | 257/82 |
| 2010/0328747 A1 | 12/2010 | Jikutani et al. | | |
| 2011/0002127 A1 * | 1/2011 | Ter Laak | G02B 3/0012 | 362/296.01 |
| 2011/0037825 A1 | 2/2011 | Jikutani et al. | | |
| 2011/0096508 A1 * | 4/2011 | Bita | B81C 1/00269 | 361/728 |
| 2011/0109713 A1 | 5/2011 | Yamaguchi et al. | | |
| 2011/0115872 A1 | 5/2011 | Harasaka et al. | | |
| 2011/0127912 A1 * | 6/2011 | Lee | F21S 48/1159 | 315/32 |
| 2011/0170155 A1 | 7/2011 | Jikutani et al. | | |
| 2011/0228035 A1 | 9/2011 | Ishii et al. | | |
| 2011/0267415 A1 | 11/2011 | Ohba et al. | | |
| 2012/0121297 A1 | 5/2012 | Jikutani et al. | | |

FOREIGN PATENT DOCUMENTS

| | | |
|---|---|---|
| JP | 62-58066 | 4/1987 |
| JP | 3-57038 | 3/1991 |
| JP | 6-340117 | 12/1994 |
| JP | 2004-6592 | 1/2004 |
| JP | 2004-363143 | 12/2004 |
| JP | 2007-79295 | 3/2007 |
| JP | 2011-198857 | 10/2011 |
| JP | 2011-198858 | 10/2011 |
| WO | WO 2011/078196 A1 | 6/2011 |

* cited by examiner

METHOD FOR MANUFACTURING AN OPTICAL UNIT

BACKGROUND OF THE INVENTION

1. Field of the Invention

An aspect of the present invention relates to a method for manufacturing an optical unit.

2. Description of the Related Art

Recently, an image quality with a higher definition is desired for a multi-color image forming apparatus. Accordingly, speeding up progresses year by year and use as an on-demand printing system is being provided for simple printing. Specifically, a two-dimensional array element with a configuration of two-dimensionally arrayed surface-emitting lasers is used so that it may be possible to set a sub-scanning interval on a photoconductor body at 1/n of a recording density and it may be possible to form a matrix configuration with a unit pixel of plural or n×m dots (for example, Japanese Patent Application Publication No. 2004-006592 and Japanese Patent Application Publication No. 2007-079295).

Furthermore, in an optical system which generally has a semiconductor laser element, etc., including a surface-emitting laser element, returned light, that is, reflected light from a lens or a cover glass, may return to and be incident on a laser element having emitted light, and in such a case, a variation in an amount of light from the laser element may be caused. Hence, a structure of an inclined cover glass for preventing such a variation in an amount of light is disclosed for example, Japanese Utility Model Application Publication No. 61-059368 and Japanese Utility Model Application Publication No. 62-058066).

Meanwhile, the number of electrodes is also large in a case of a surface-emitting laser element such as a surface-emitting laser array with two-dimensionally arrayed surface-emitting lasers, and if installation into a housing such as a can package used for a general semiconductor laser, etc., is conducted, a shape of such a housing may be large. Hence, for a housing for placing a surface-emitting laser array chip, a structure provided by combining a concave ceramic package made of a ceramic and a cover glass is devised, and furthermore, a structure provided by placing a light-receiving element inside of a concave ceramic package is devised.

When a surface-emitting laser array chip and a light-receiving element are placed in such a housing with a structure provided by combining a concave ceramic package and a cover glass, a surface-emitting laser array chip with a surface-emitting laser array formed thereon, etc., is fixed on a concave bottom of a ceramic package, and subsequently, an electrode provided in the surface-emitting laser array chip and an electrode provided on the concave bottom of the ceramic package are connected by wire bonding to conduct it. Additionally, a cover glass is subsequently placed on a top of a concave ceramic package.

Herein, a relative positional relationship between the surface-emitting laser array chip and a light-receiving element, and a relative positional relationship between the surface-emitting laser array chip and light-receiving element and the cover glass may be important. Meanwhile, when the surface-emitting laser array chip and the light-receiving element are placed in the ceramic package, placement is conducted with reference to an external side wall of the ceramic package, etc. On the other hand, the surface-emitting laser array chip and the light-receiving element are elements which are operated by electricity, etc., and accordingly, connection is conducted by wire bonding, wherein a wiring line formed on the ceramic package is recognized by image recognition in the wire bonding and connection is conducted by a bonding wire based on such a recognized wiring line, etc.

Furthermore, a ceramic package is generally fabricated by dividing a substrate with plural ceramic packages formed thereon. A concave portion and a convex portion are formed on a side face portion of a ceramic package fabricated by being divided accordingly, and hence, when a surface-emitting laser array chip which is a light-emitting element and a light-receiving element, etc., are placed with reference to such a side face portion, such elements, etc., may not be placed at a desired position on the ceramic package. In such a case, in a process of conducting wire bonding, it may be impossible to conduct connection by a desired bonding wire or the surface-emitting laser array chip or the light-receiving element may be broken. Additionally, for a method for forming a side face portion of a ceramic package in a desired shape, a method for cutting a ceramic package by dicing or a method for polishing a side face portion of a post-divided ceramic package may be conceived of, but any of the methods may require a lot of time and cost and hence, may not be practical.

SUMMARY OF THE INVENTION

According to one aspect of the present invention, there is provided a method for manufacturing an optical unit, including a step of bringing two side face portions of a ceramic package into contact with two contact portions of a jig, a step of placing plural light-receiving and light-emitting elements in a predetermined region of the ceramic package with reference to the contact portions of the jig, and a step of connecting the plural light-receiving and light-emitting elements to a wiring line part formed in the ceramic package by using a bonding wire, wherein at least one of the plural light-receiving and light-emitting elements is placed between one of the two contact portions of the jig and another one of the plural light-receiving and light-emitting elements in the step of placing the plural light-receiving and light-emitting elements.

DETAILED DESCRIPTION OF THE PREFERRED EMBODIMENTS

Figure 1:
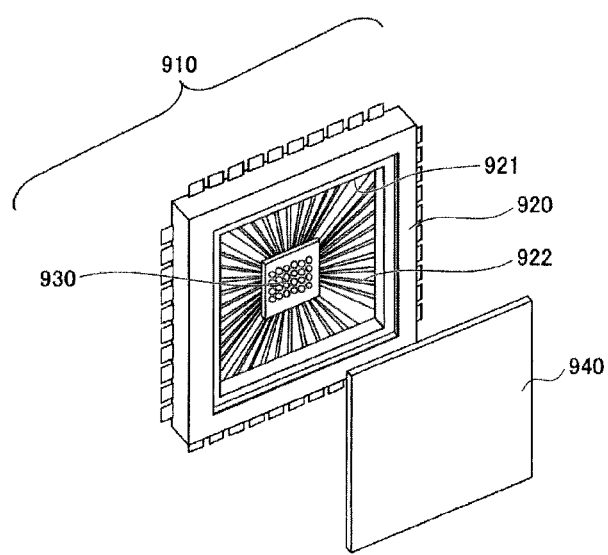
FIG. 1 is an illustration diagram of a surface-emitting laser module.

Some embodiments of the present invention will be described. Additionally, an identical reference numeral is applied to an identical member, etc., and a description thereof will, be omitted.

First Embodiment

Figure 2:
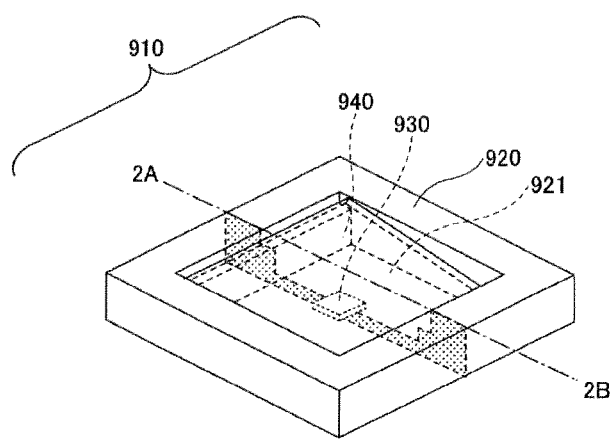
FIG. 2 is a perspective view of a surface-emitting laser module.
Figure 3:
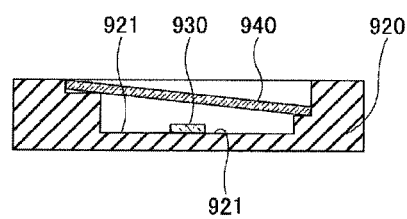
FIG. 3 is a cross-sectional view of a surface-emitting laser module.

First, a ceramic package will be described. An optical unit installed in an image informing apparatus, etc., has a surface-emitting laser module 910 as illustrated in FIG. 1 to FIG. 3. In such a surface-emitting laser module 910, a surface-emitting laser (Vertical Cavity Surface Emitting LASER: VCSEL) element 930 and a light-receiving element which is not illustrated in the figures, etc., are placed on a concave bottom face 921 formed on a ceramic package 920. Furthermore, a wiring line 922 is formed on the concave bottom face 921 of the ceramic package 920, and connected to the connecting terminals of the surface-emitting laser element 930 and light-receiving element by a bonding wire which is not illustrated in the figures. Furthermore, a transparent and plate-shaped cover glass 940 is placed at a side of a light emission direction of the surface-emitting laser element 930 so as to cover the ceramic package 920. Additionally, FIG. 1 is an exploded perspective view of the surface-emitting laser module 910 while FIG. 2 is a perspective view of the surface-emitting laser module and FIG. 3 is a cross-sectional view provided by cutting along a dashed line 2A-2B in FIG. 2.

Figure 4B:
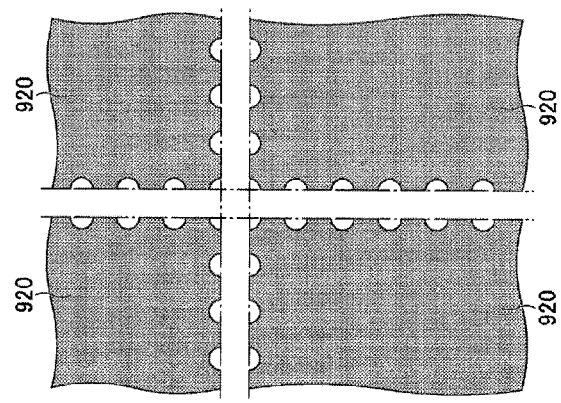
FIG. 4A, FIG. 4B, and FIG. 4C are illustration diagrams (1) of a method for manufacturing a ceramic package.
Figure 4A:
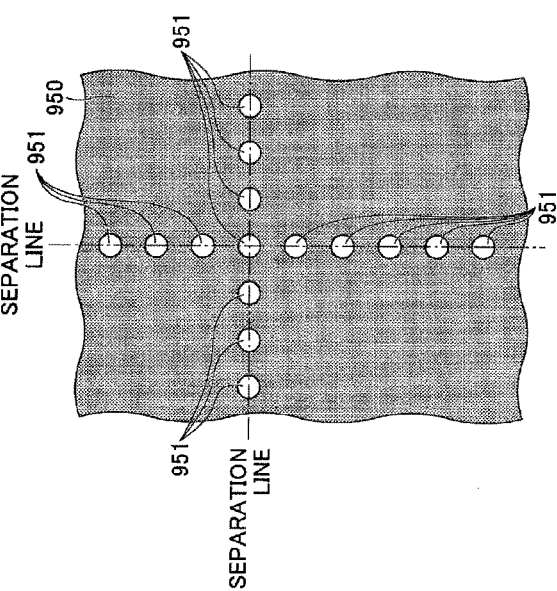
Figure 4C:
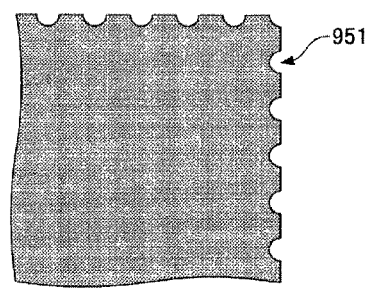
Figure 5:
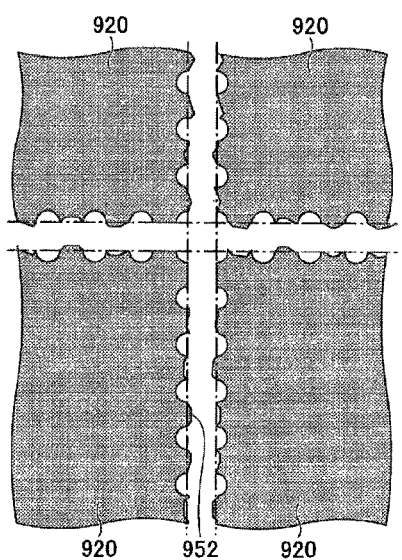
FIG. 5 is an illustration diagram (2) of a method for manufacturing a ceramic package.

Meanwhile, such a ceramic package 920 used for the surface-emitting laser module 910 is formed of a ceramic with a shape which is generally a square. For a process for forming such a ceramic package 920, a ceramic substrate 950 with pre-separated plural ceramic packages 920 formed thereon is divided to be separated into and fabricated as each ceramic package 920 as illustrated in FIG. 4A. Hence, plural openings 951 are formed along a separation line for separation into each ceramic package 920, so that the ceramic substrate 950 is divided along the separation line on which the plural openings 951 are formed, whereby it may be possible to be separated into each ceramic package 920 as illustrated in FIG. 4B. The ceramic package 920 is thus fabricated, wherein an outer side face portion of a formed ceramic package 920 is not linearly formed as illustrated in FIG. 4C but such a side face portion has a concave portion and a convex portion as illustrated in FIG. 5, etc., described below so that a protruding portion 952 which protrudes from a separation line is formed, because formation is conducted by dividing the ceramic substrate 950, etc. Specifically, linear division along the plural openings 951 as illustrated in FIG. 4B, etc., is not conducted but division is conducted to provide distorted concave and convex shapes between the openings 951 as illustrated in FIG. 5. That is, a side face portion of the ceramic package 920 is not linear but has a distorted shape with a concave portion and a convex portion.

Meanwhile, when the surface-emitting laser module 910 having the ceramic package 920 is placed in an optical unit as described above, placement is conducted in on a condition that a side face portion of the ceramic package 920 contacts a predetermined contact face of the optical unit. Therefore, even in a process for manufacturing an optical unit, a light-emitting element and a light-receiving element are placed in the ceramic package 920 in such a manner that the surface-emitting laser element 930 which is a light-emitting element and a light-receiving element are provided at predetermined position in the optical unit. Specifically, a side face portion of the ceramic package 920 is caused to contact a predetermined contact face of a jig for manufacturing to conduct positioning thereof, and subsequently, a light-emitting element and a light-receiving element are placed in the ceramic package 920, similarly to a case where the surface-emitting laser module 910 having the ceramic package 920 is placed in the optical unit. Additionally, a side face portion of the ceramic package 920 which portion contacts a predetermined contact face of a jig for manufacturing may be described as a contact side face in the present embodiment.

Furthermore, it may be necessary that a light-emitting element such as the surface-emitting laser element 930 and a light-receiving element such as a photodiode are electrically connected to the wiring line 922 provided on the bottom face 921 of the ceramic package 920 by a bonding wire in a process for manufacturing an optical unit in order to application of a driving voltage, etc., or outputting of a electric signal. For wire bonding conducted herein, the wiring line 922 provided on the bottom face 921 of the ceramic package 920 is identified by image recognition and wire bonding is conducted based on a position of such an identified wiring line, etc. Therefore, a reference position in a case where the surface-emitting laser element 930 which is a light-emitting element and a light-receiving element, etc., are placed in the ceramic package 920 is different from a reference position in a case where wire bonding is conducted. Hence, in a process for conducting wire bonding, a capillary in a wire bonding device may contact a light-receiving element to break the light-receiving element, etc.

Figure 6:
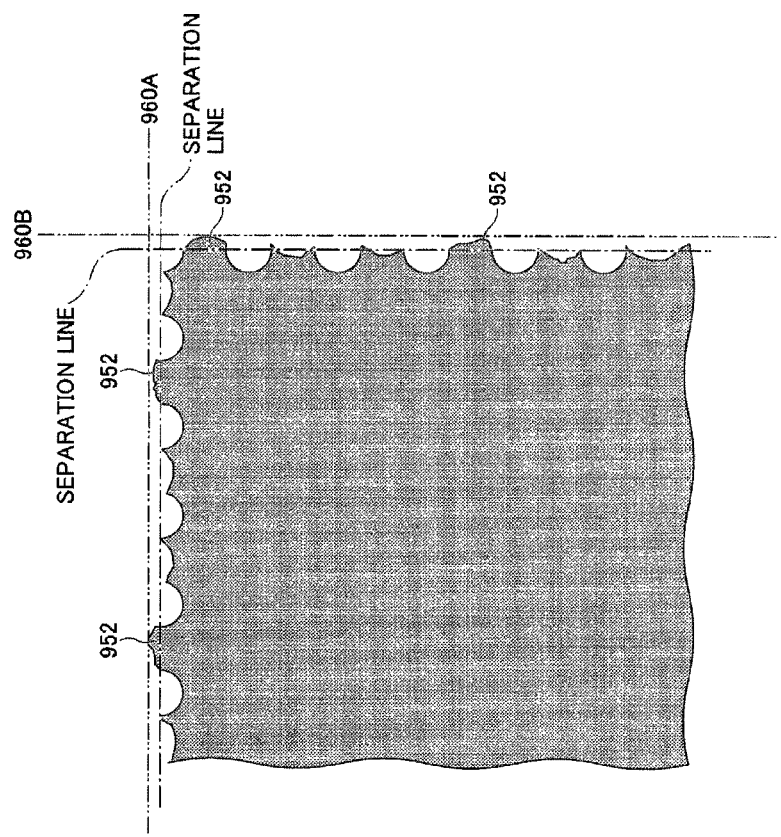
FIG. 6 is an illustration diagram of a ceramic package.

Such a matter will be described in more detail. When a side face portion of the ceramic package 920 is formed in a way of distorted division as illustrated in FIG. 5, the protruding portion 952 from a separation line is usually present. When a side face portion of the ceramic package 920 is caused to contact a contact face which is a placement face, etc., for a jig for manufacturing or an optical unit, such a protruding portion 952 contacts the placement face, etc., for a jig for manufacturing or an optical unit. Specifically, the protruding portion 952 at a side face portion of the ceramic package 920 contacts contact faces 960A and 960B of a jig for manufacturing as illustrated in FIG. 6, and accordingly, a reference position for placing the surface-emitting laser element 930 and a light-receiving element, etc., may be shifted for each ceramic package 920. Additionally, the ceramic package 920 is formed to have a generally square shape, wherein when contact with a placement face, etc., for a jig for manufacturing or an optical unit is conducted, contact is provided at a side face portion which is two sides of a generally square or a generally rectangular in the ceramic package 920.

Figure 7A:
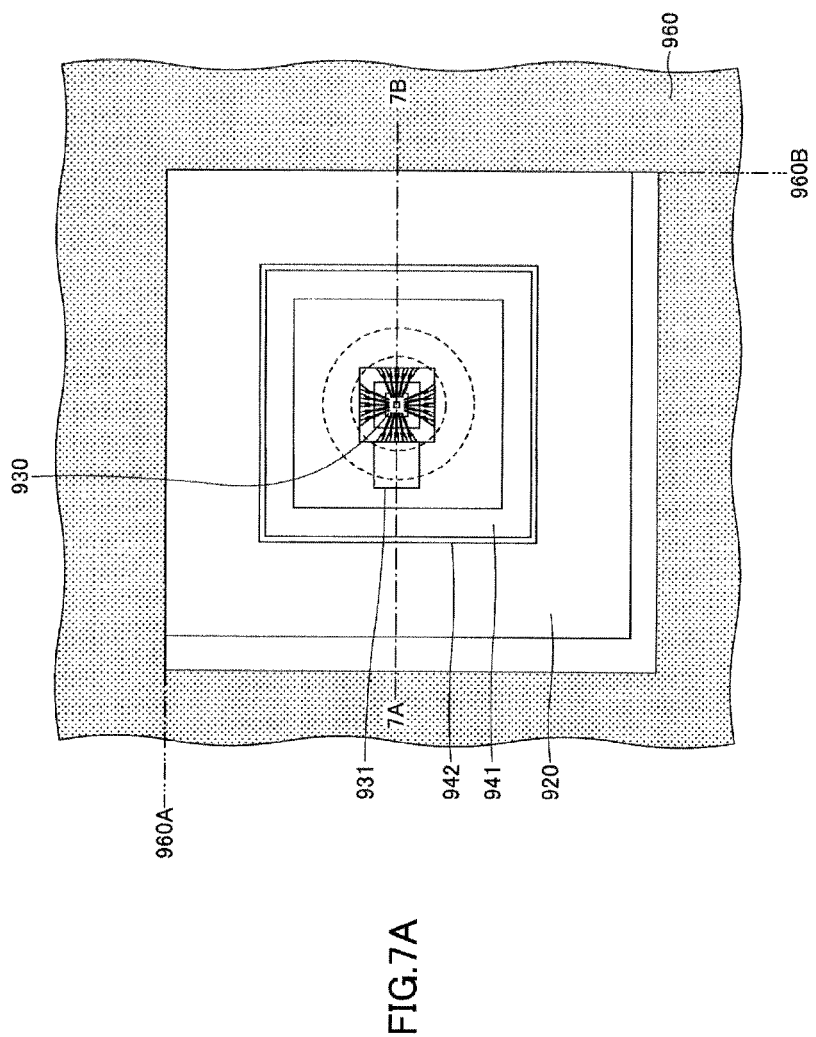
FIG. 7A and FIG. 7B are illustration diagrams (1) of a method for manufacturing an optical unit by using a ceramic package.
Figure 7B:
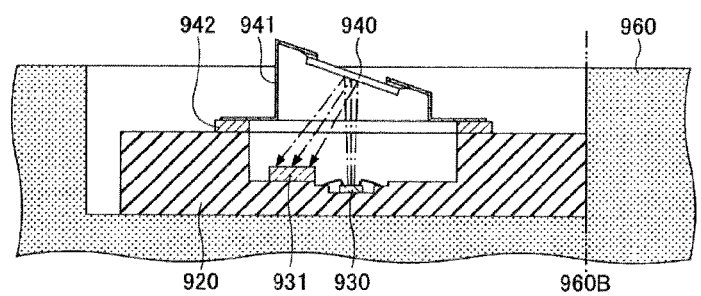

Herein, a case as illustrated in FIG. 7A and FIG. 7B will be considered. Specifically, a case will be considered where two adjacent sides in the ceramic package 920 contact two contact faces 960A and 960B of a jig for manufacturing 960 and a light-receiving element 931 placed on the surface-emitting laser module 910 is placed at a position further away from the surface-emitting laser element 930 with respect to the contact face 960B of the jig for manufacturing. Additionally, FIG. 7A and FIG. 7B illustrate a condition that a frame 941 having a cover glass 940 is joined to the ceramic package 920 via a joining plate 942. Furthermore, FIG. 7A is a top view of the surface-emitting laser module 910 in such a condition and FIG. 7B is a cross-sectional view provided by cutting along a dashed line 7A-7B in FIG. 7A.

Figure 8A:
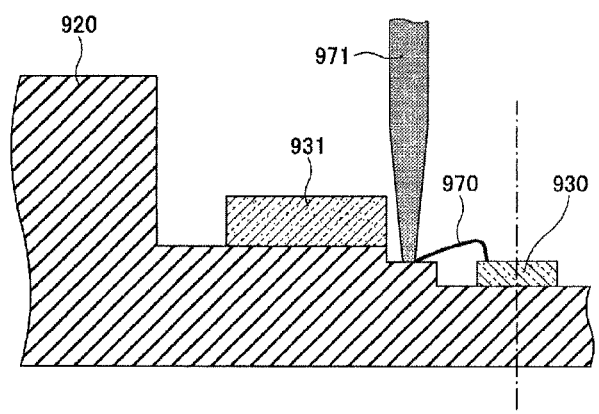
FIG. 8A, FIG. 8B, and FIG. 8C are illustration diagrams (2) of a method for manufacturing an optical unit by using a ceramic package.

For example, when ideal division is conducted along a separation line as illustrated in FIG. 8A on a condition that the ceramic package 920 is placed on the jig for manufacturing 960 as illustrated in FIG. 7A and FIG. 7B, the surface-emitting laser element 930 which is a light-emitting element and the light-receiving element 931 are placed at desired positions in the ceramic package 920. Therefore, when a wiring line which is formed on a bottom face of the ceramic package 920 and is not illustrated in the figures and the surface-emitting laser element 930 which is a light-emitting element are connected by a bonding wire 970, the wiring line is identified by image recognition and wire bonding is conducted based on a position of an identified wiring line, etc., so that a capillary 971 in a wire bonding device may not contact the light-receiving element 931.

Figure 8B:
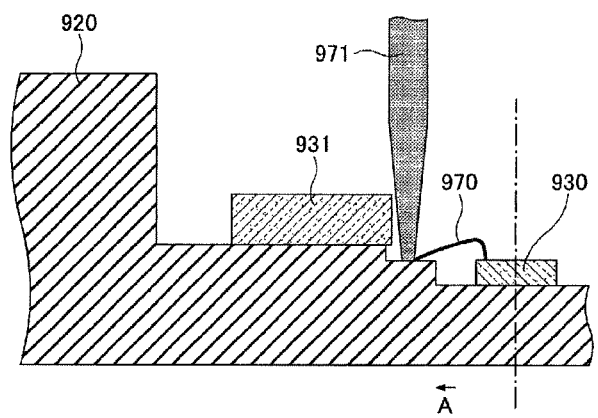

Furthermore, when the protruding portion 952 at a side face of the ceramic package 920 is small as illustrated in FIG. 8B, a position of the ceramic package 920 with respect to the surface-emitting laser element 930 which is a placed light-emitting element and the light-receiving element 931 is a position which is slightly shifted in a direction indicated by an arrow A. In such a case, a shift is small, so that when a wiring line which is formed on a bottom face of the ceramic package 920 and is not illustrated in the figures and the surface-emitting laser element 930 which is a light-emitting element are connected by the bonding wire 970 similarly to the case of FIG. 8A, a wiring line is identified by image recognition and wire bonding is conducted based on a position of an identified wiring line, etc., whereby the capillary 971 in a wire bonding device may not contact the light-receiving element 931.

Figure 8C:
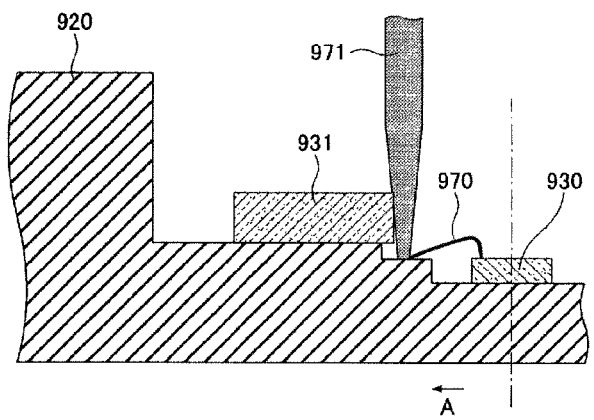

However, when the protruding portion 952 at a side face of the ceramic package 920 is large as illustrated in FIG. 8C, a position of the ceramic package 920 with respect to the surface-emitting laser element 930 which is a placed light-emitting element and the light-receiving element 931 may be a position which is greatly shifted in a direction indicated by an arrow A. Accordingly, when a wiring line which is formed on a bottom face of the ceramic package 920 and is not illustrated in the figures and the surface-emitting laser element 930 which is a light-emitting element are connected by the bonding wire 970, a wiring line is identified by image recognition and wire bonding is conducted based on a position of an identified wiring line, etc., whereby the capillary 971 in a wire bonding device may contact the light-receiving element 931 to break the light-receiving element 931, etc. If the light-receiving element 931 is thus broken, etc., a surface-emitting laser module may be no good, whereby a yield, etc., may be degraded resulting in higher costs.

(A Method for Manufacturing an Optical Unit)

Next, a method for manufacturing an optical unit in the present embodiment will be described based on FIG. 9A and FIG. 9B-FIG. 12A and FIG. 12B.

Figure 9A:
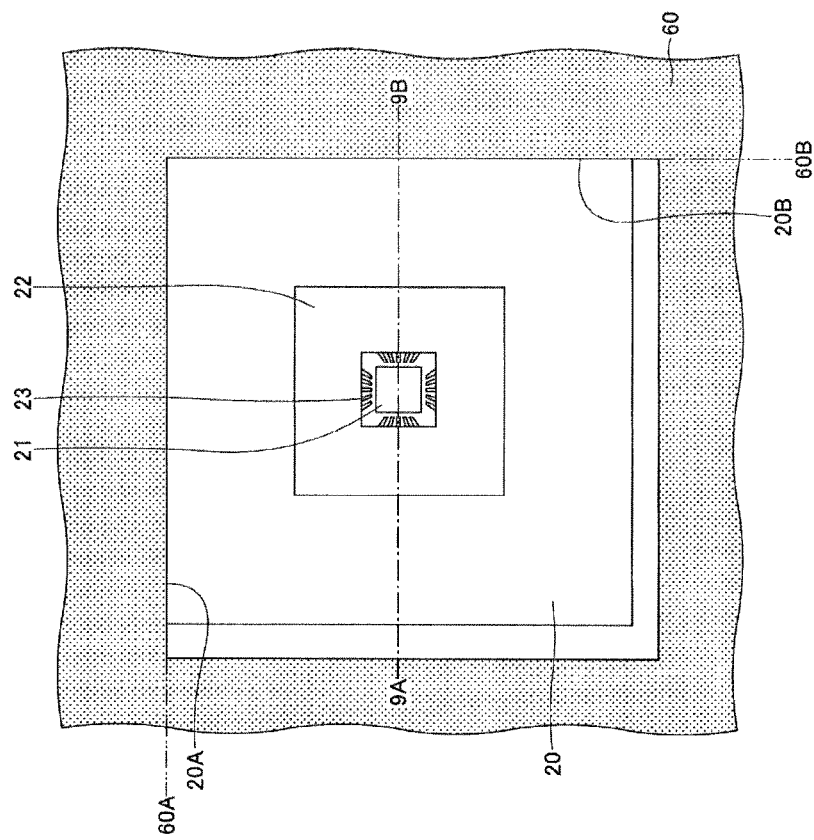
FIG. 9A and FIG. 9B are flow diagrams (1) of a method for manufacturing an optical unit in a first embodiment.
Figure 9B:
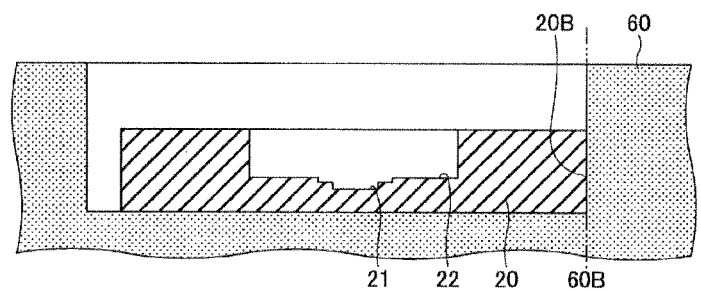

First, two adjacent side face portions of a ceramic package 20 with a generally square shape or a generally rectangular shape are caused to contact with contact faces 60A and 60B of a jig for manufacturing 60 as illustrated in FIG. 9A and FIG. 9B. In the present embodiment, a side face contacting the contact faces 60A and 60B of the jig for manufacturing, among side face portions of the ceramic package 20, may be described as contact side faces 20A and 20B of each ceramic package 20. On a concavely formed portion in the ceramic package 20, a bottom face part 21 on which a surface-emitting laser element 30 on which a light-emitting element described below is placed and a step part 22 on which a light-receiving element is paced are formed, and moreover, a wiring line part 23 is formed which is connected to a connecting terminal which is not illustrated in the figures in the surface-emitting laser element 30 which is a light-emitting element, etc., by a bonding wire. Additionally, the step part 22 is formed at a position higher than that of the bottom face part 21 in the ceramic package 20 in the present embodiment. Furthermore, FIG. 9A is a top view of the ceramic package 20 in such a condition and FIG. 9B is a cross-sectional view provided by cutting along a dashed line 9A-9B in FIG. 9A.

Figure 10A:
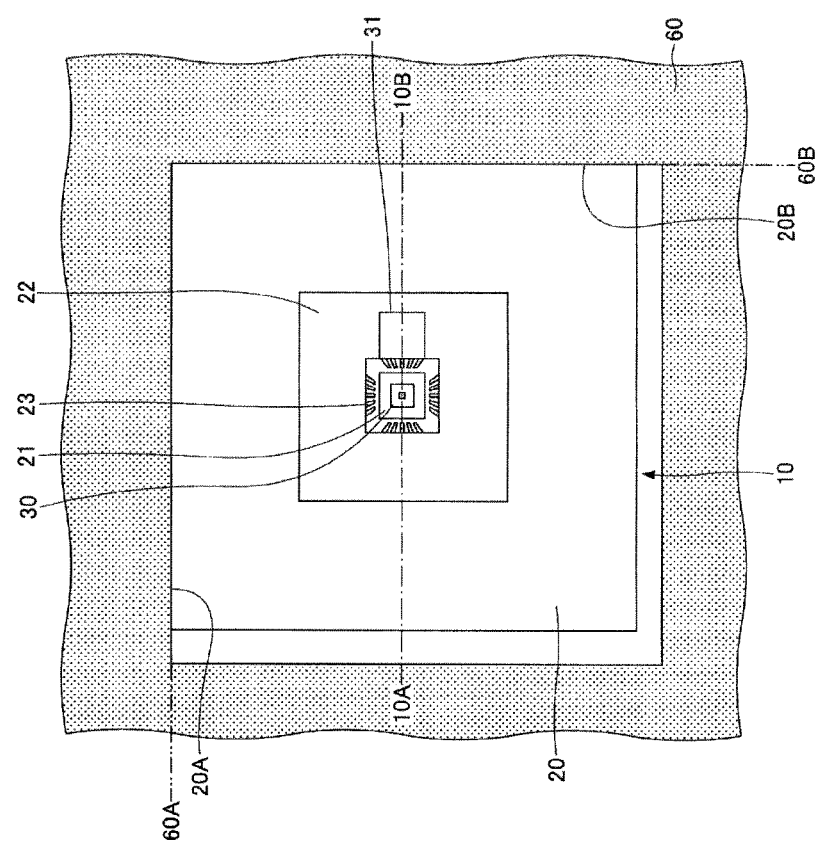
FIG. 10A and FIG. 10B are flow diagrams (2) of a method for manufacturing an optical unit in a first embodiment.
Figure 10B:
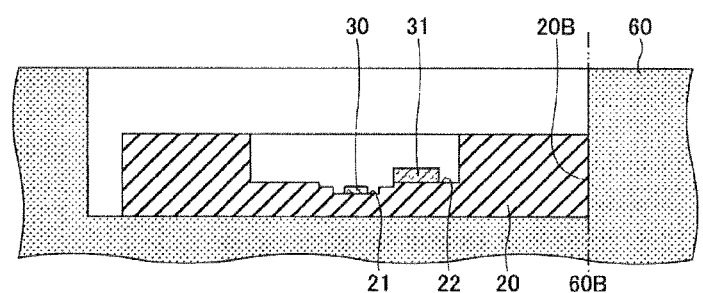

Next, in the ceramic package 20, the surface-emitting laser element 30 which is a light-emitting element is placed (or mounted) on the concavely formed bottom face part 21 and the light-receiving element 31 is placed (or mounted) on the step part 22, as illustrated in FIG. 10A and FIG. 10B. Herein, the light-receiving element 31 is provided at a position which is provided between the jig for manufacturing and the surface-emitting laser element 30, specifically, the light-receiving element 31 is placed between a contact face 60B of the jig for manufacturing 60 and the surface-emitting laser element 30, in a case as illustrated in FIG. 10A and FIG. 10B. In a process for placing the surface-emitting laser element 30 and the light-receiving element 31, the surface-emitting laser element 30 and the light-receiving element 31 are placed with reference to the jig for manufacturing 60, that is, with reference to the contact faces 60A and 60B of the jig for manufacturing 60. Hence, positions at which the surface-emitting laser element 30 and the light-receiving element 31 are placed are slightly different positions for each surface-emitting laser module 10, depending on sizes of a concave portion and a convex portion at a side face portion of the ceramic package 20. However, both the surface-emitting laser element 30 and the light-receiving element 31 are placed with reference to the contact faces 60A and 60B of the jig for manufacturing 60, and hence, a positional relationship between the surface-emitting laser element 30 and the light-receiving element 31 may not be different for each optical unit but may be generally identical. That is, relative positions of the surface-emitting laser element 30 and the light-receiving element 31 may not depend on sizes of a concave portion and a convex portion at a side face portion of the ceramic package 20, and it may be possible to conduct placement at a relatively identical position. Herein, the surface-emitting laser element 30 and the light-receiving element 31 are joined to and placed on the bottom face part 21 and the step part 22 by die-bonding, etc. Additionally, FIG. 10A is a top view of the ceramic package 20 in such a condition and FIG. 10B is a cross-sectional view provided by cutting along a dashed line 10A-10B in FIG. 10A.

Figure 11A:
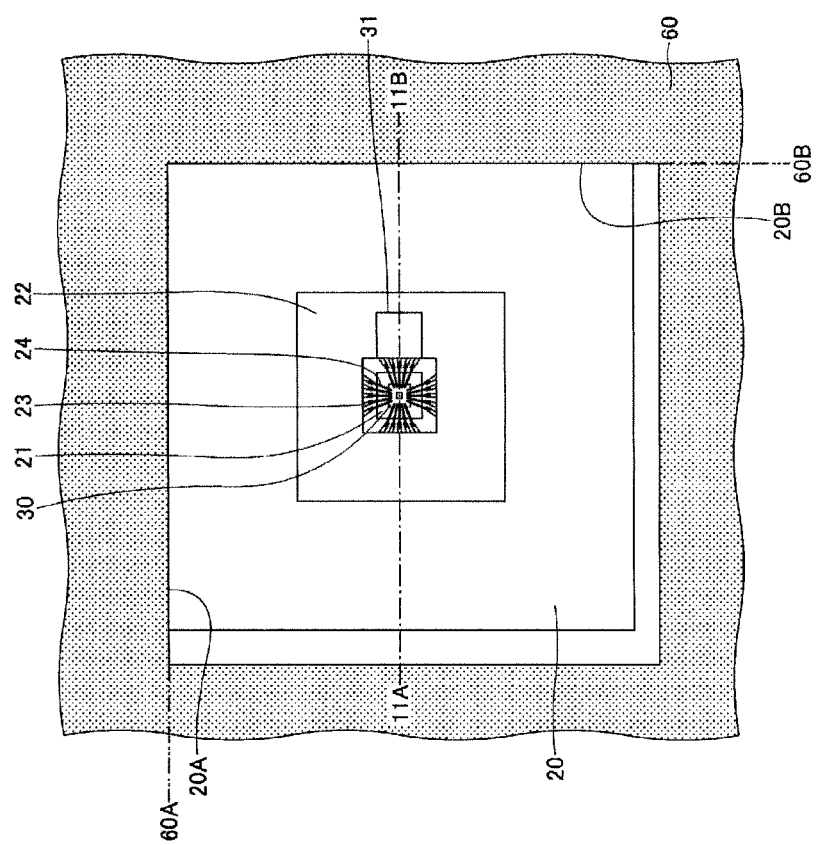
FIG. 11A and FIG. 11B are flow diagrams (3) of a method for manufacturing an optical unit in a first embodiment.
Figure 11B:
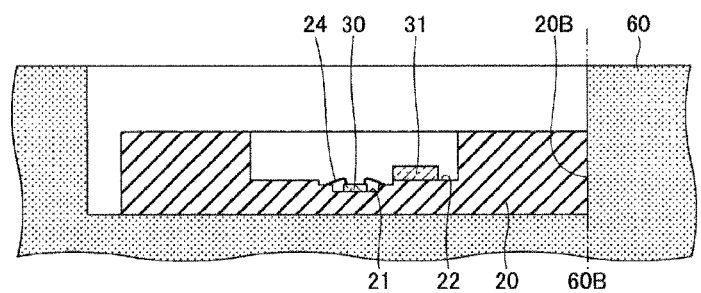

Next, the surface-emitting laser element 30 placed on the bottom face part 21 of the ceramic package 20 and the wiring line part 23 formed in the ceramic package 20 are connected by a bonding wire 24 as illustrated in FIG. 11A and FIG. 11B. Specifically, for connection by the bonding wire 24, a position of the wiring line part 23, etc., is recognized by image recognition for the wiring line part 23, etc., and the wiring line part 23 and a terminal part which is formed on the surface-emitting laser element 30 and is not illustrated in the figures are connected by the bonding wire 24 with reference to such a recognized wiring line part 23, etc. Additionally, FIG. 11A is a top view of the ceramic package 20 in such a condition and FIG. 11B is a cross-sectional view provided by cutting along a dashed line 11A-11B in FIG. 11A.

Figure 12A:
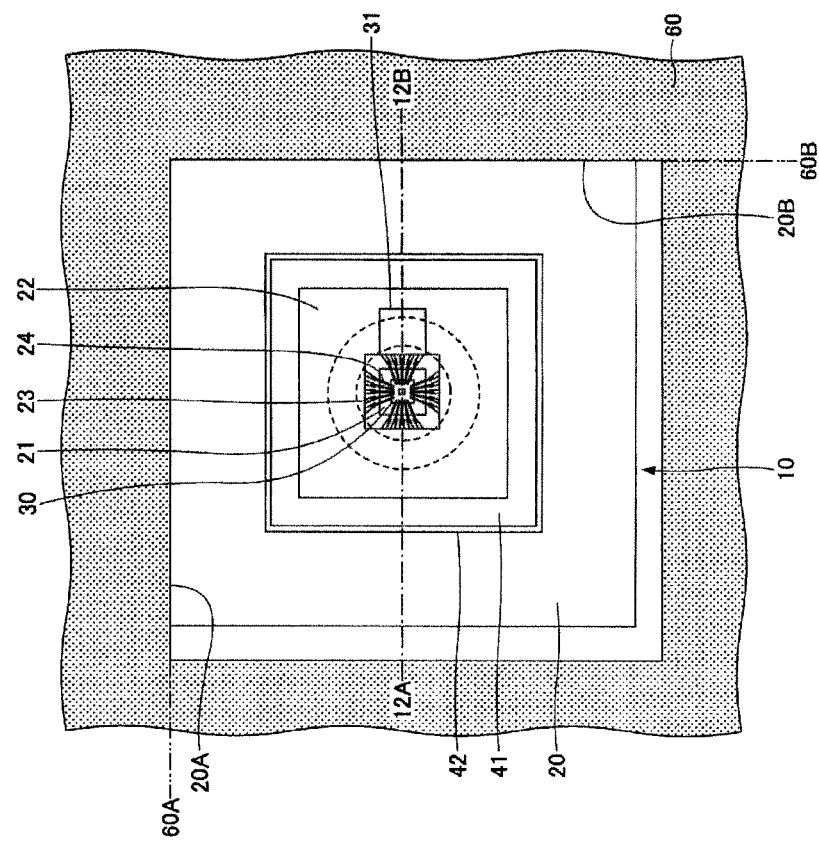
FIG. 12A and FIG. 12B are flow diagrams (4) of a method for manufacturing an optical unit in a first embodiment.
Figure 12B:
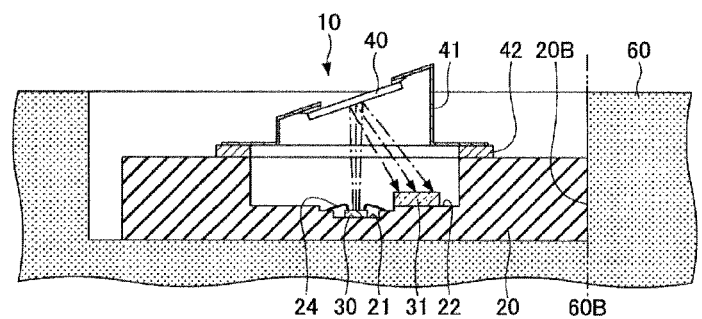

Next, a frame 41 having a cover glass 40 which is an obliquely placed transparent and plate material is joined to the package via a joining plate 42 as illustrated in FIG. 12A and FIG. 12B. Herein, the frame 41 is placed with reference to the jig for manufacturing 60, that is, with reference to the contact faces 60A and 60B of the jig for manufacturing 60. Accordingly, a position at which the frame 41 is placed in the ceramic package 20 is set at a position which is slightly different for each surface-emitting laser module depending on sizes of a concave portion and a convex portion on a side face portion of the ceramic package 20. However, the surface-emitting laser element 30 and the light-receiving element 31 are placed with reference to the contact faces 60A and 60B which are two contact portions of the jig for manufacturing 60, and the frame 41 is also placed with reference to the contact faces 60A and 60B of the jig for manufacturing 60. Therefore, a relative positional relationship between the surface-emitting laser element 30 and light receiving element 31 and the cover glass 40 in the frame 41 may not be different for each optical unit but may be able to be identical. Additionally, FIG. 12A is a top view of the ceramic package 20 in such a condition and FIG. 12B is a cross-sectional view provided by cutting along a dashed line 12A-12B in FIG. 12A.

Next, a process for wire bonding as illustrated in FIG. 11 in a manufacturing method in the present embodiment will be described in more detail.

Figure 13A:
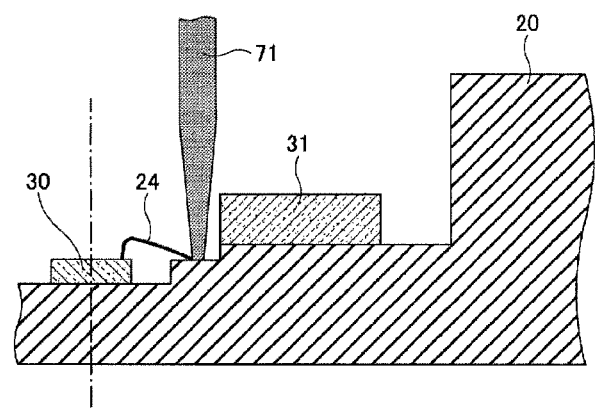
FIG. 13A, FIG. 13B, and FIG. 13C are illustration diagrams (1) of a method for manufacturing an optical unit in a first embodiment.

For example, when ideal division along a separation line is conducted as illustrated in FIG. 13A, the surface-emitting laser element 30 which is a light-emitting element and the light-receiving element 31 are placed at desired positions in the ceramic package 20. Therefore, when the wiring line part 23 formed on the ceramic package 20 and the surface-emitting laser element 30 which is a light-emitting element are connected by the bonding wire 24, a wiring line is identified by image recognition and wire bonding is conducted based on a position of an identified wire line, etc., so that the capillary 71 in a wire bonding device may not contact the light-receiving element 31.

Figure 13B:
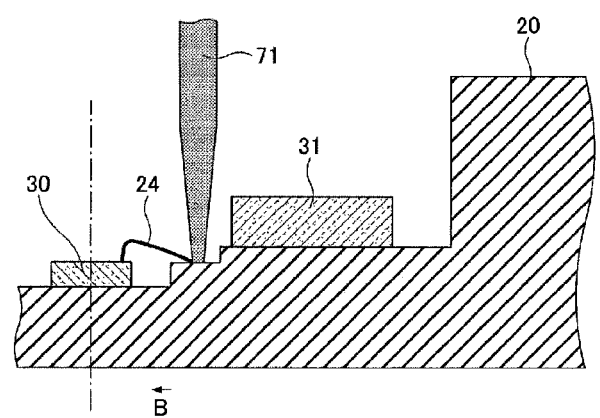

Furthermore, when a portion protruding from an ideal separation line on a side face portion of the ceramic package 20 is small as illustrated in FIG. 13B, a relative position of the ceramic package 20 with respect to the surface-emitting laser element 30 which is a placed light-emitting element and the light-receiving element 31 is a position which is slightly shifted in a direction indicated by an arrow B. In such a case, the light-receiving element 31 is shifted in a direction away from a capillary 71, and hence, when the wiring line part 23 formed on the ceramic package 20 and the surface-emitting laser element 30 which is a light-emitting element are connected by the bonding wire 24 similarly to the case of FIG. 13A, a wiring line is identified by image recognition and wire bonding is conducted based on a position of an identified wiring line, etc., so that the capillary 71 in a wire boning device may not contact the light-receiving element 31.

Figure 13C:
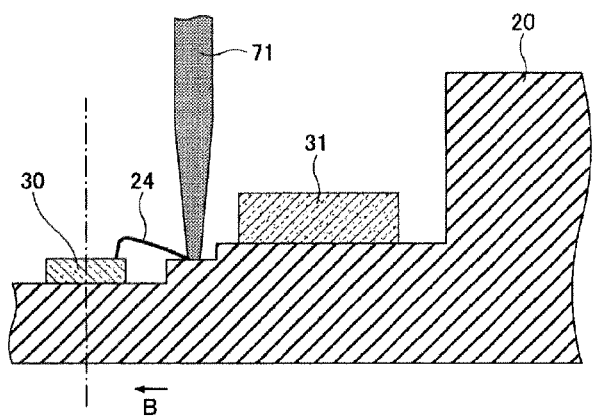

Furthermore, when a portion protruding from an ideal separation line on a side face portion of the ceramic package 20 is large as illustrated in FIG. 13C, a relative position of the ceramic package 20 with respect to the surface-emitting laser element 30 which is a placed light-emitting element and the light-receiving element 31 is a position which is greatly shifted in a direction indicated by an arrow B. However, in such a case, the light-receiving element 31 is also shifted in a direction away from the capillary 71, and hence, when the wiring line part 23 formed on the ceramic package 20 and the surface-emitting laser element 30 which is a light-emitting element are connected by the bonding wire 24 similarly to the case of FIG. 13A, a wiring line is identified by image recognition and wire bonding is conducted based on a position of an identified wiring line, etc., so that the capillary 71 in a wire bonding device may not contact the light-receiving element 31.

Hence, the light-receiving element 31 may not be broken, etc., in a process for wire bonding of the surface-emitting laser element 30 and the wiring line part 23 in a manufacturing method in the present embodiment, whereby it may be possible to improve a yield of a manufactured optical unit.

Figure 14A:
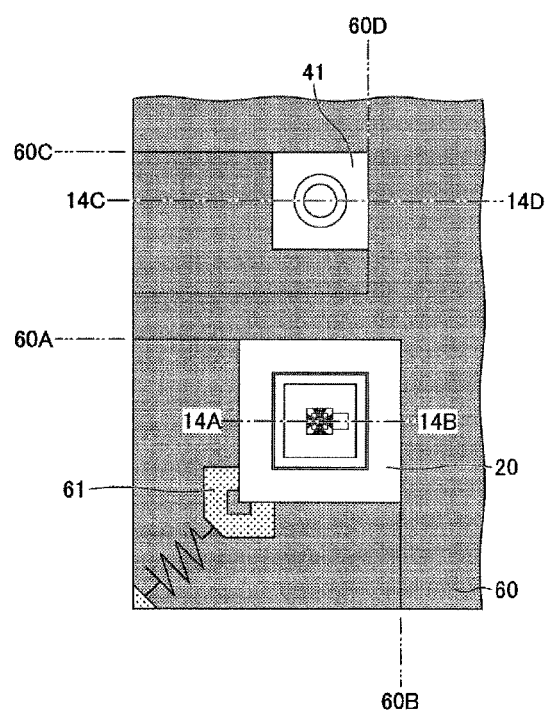
FIG. 14A, FIG. 14B, and FIG. 14C are illustration diagrams (2) of a method for manufacturing an optical unit in a first embodiment.
Figure 14B:
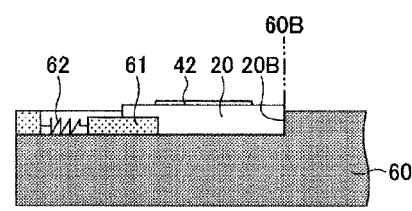
Figure 14C:
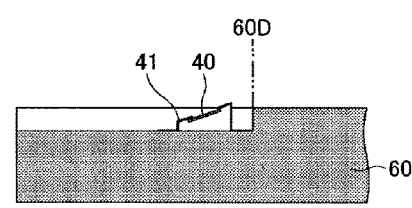
Figure 15:
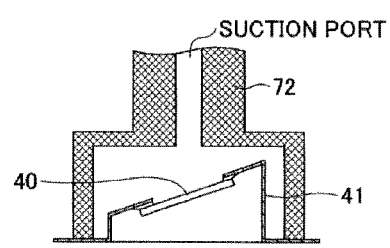
FIG. 15 is an illustration diagram (3) of a method for manufacturing an optical unit in a first embodiment.

Next, a process for joining the frame 41 having the cover glass 40 as illustrated in FIG. 12A and FIG. 12B to the ceramic package 20 in a manufacturing method in the present embodiment will be described in more detail based on FIG. 14A, FIG. 14B, and FIG. 14C. As described above, the frame 41 having the cover glass 40 is placed on the ceramic package 20 whose positioning has been conducted with reference to the contact faces 60A and 60B of the jig for manufacturing 60. Specifically, as illustrated in FIG. 14A, FIG. 14B, and FIG. 14C, two side face portions of the frame 41 are caused to contact with contact faces 60C and 60D of the jig for manufacturing 60 to conduct positioning of the frame 41, and subsequently, the frame 41 is suctioned by a suction jig 72 for suctioning a frame 41 as illustrated in FIG. 15 to place the frame 41 at a predetermined position on the ceramic package 20. A position of placement of thus placed frame 41 is set with reference to the contact faces 60A and 60B of the jig for manufacturing 60 whereby it may be possible to conduct placement at a desired position with respect to the surface-emitting laser element 30 and the light-receiving element 31. Subsequently, it may be possible to join the frame 41 to the ceramic package 20 by being joined by seam welding via a joining plate 42. Additionally, the frame 41 is formed in such a manner that an outline thereof is a generally square shape. Additionally, FIG. 14A is a top view of such a condition, FIG. 14B is a cross-sectional view provided by cutting along a dashed line 14A-14B in FIG. 14A, and FIG. 14C is a cross-sectional view provided by cutting along a dashed line 14C-14D in FIG. 14A.

The case where the two contact faces 60A and 60B are formed for the jig for manufacturing 60 has been described in the present embodiment, but, as long as it may be possible for either one to contact a side face portion of the ceramic package 20 in a planar or linear form, the other may be formed by one attaining point contact, such as a pin. Furthermore, although a case of a light-emitting element and a light-receiving element has been described in the above description, it may also be possible to provide application to a case among plural light-emitting elements or among plural light-receiving elements. In the present embodiment, a light-emitting element or a light-receiving element may be described as a light-receiving and light-emitting element, and plural light-receiving and light-emitting elements shall include plural light-receiving elements, plural light-emitting elements, and a combination of a light-receiving element(s) and a light-emitting element(s).

Subsequently, a surface-emitting laser module provided by installing the surface-emitting laser element 30 and the frame 41, etc., in the ceramic package 20 is removed from the jig for manufacturing 60 and such a surface-emitting laser module is placed at a predetermined position in an optical unit. Herein, the surface-emitting laser module is placed in such a manner that the two side face portions having contacted with the contact faces 60A and 60B of the jig for manufacturing 60 in the ceramic package 20 contact predetermined contact faces in an optical unit, so that it may be possible to manufacture the optical unit.

(An Optical Unit)

Next, an optical unit in the present embodiment will be described based on FIG. 16-FIG. 19. In an optical unit in the present embodiment, plural light beams from a surface-emitting laser array constituting a surface-emitting laser module 10 are emitted while adjustment is conducted in such a manner that respective light-emitting sources are arranged symmetrically with respect to an optical axis in a plane (YZ-plane) orthogonal to an optical axis of a coupling lens 602 by an arrangement adjustment of the coupling lens 602 in X, Y, and Z directions and a beam from each light-emitting source is a parallel light beam.

An aperture mirror 603 is formed into a plate shape and arranged to be generally orthogonal to an optical axis. An opening with a diameter smaller than a diameter of a light beam is provided on a central portion, wherein a light beam passing through the opening is directed through the coupling lens and a light beam dividing prism 708 toward a polygon mirror which is not illustrate in the figures. Additionally, the light bean dividing prism 708 is composed of a half mirror face 641 and a mirror face 642.

On a control board 606, a power control circuit for keeping powers of light emission of the above-mentioned light-emitting sources constant or a driving circuit for modulating each light-emitting source depending on image information are formed and is held integrally with the coupling lens 602 to constitute an optical unit.

Furthermore, in the optical unit in the present embodiment, a holder member 608 for holding the coupling lens 602 and a base member 607 for holding the control board 606 on which the surface-emitting laser module 10 is mounted are joined at a reference plane orthogonal to an optical axis of the coupling lens 602 and fastened by a screw to provide an integrated configuration.

Although any of the base member 607 and the holder member 608 is formed by aluminum die casting in the present embodiment, different materials may be provided as long as approximately identical thermal expansion coefficients are provided. On the base member 607, the aperture mirror 603, etc., is arranged for detecting beam intensity from a surface-emitting laser array in the surface-emitting laser module 10 described above.

Furthermore, in the optical unit in the present embodiment, a back side of the control board 606 is pressurized by a plate spring part 620 of a pressurization member 609 molded of a sheet metal, and three-point anchor parts (folding parts) 618 are fitted into holes 619 of the control board 606 to assemble the control board 606 on a reference plane which is not illustrated in the figures, whereby positioning of a surface-emitting laser array in the surface-emitting laser module 10 with respect to the base member 607 is conducted.

Three studs 616 are formed on the base member 607 and penetrate through penetration holes 617 provided by perforating the control board 606, and the pressurization member 609 is fastened on the studs 616 by a screw to support the control board 606. Because a configuration is provided in such a manner that a back side of the control board 606 is pressurized by the pressurization member 609 and the control board 606 is not directly fastened on the base member 607, etc., it may be possible to position and support a surface-emitting laser array composing the surface-emitting laser module 10 on the base member 607 certainly without applying a load to the control board 606. Additionally, as long as the pressurization member 609 is a material having an elasticity, formation may be conducted with a resin, etc., and interposition of an elastic member such as a rubber may be conducted instead of the plate spring part.

Figure 18:
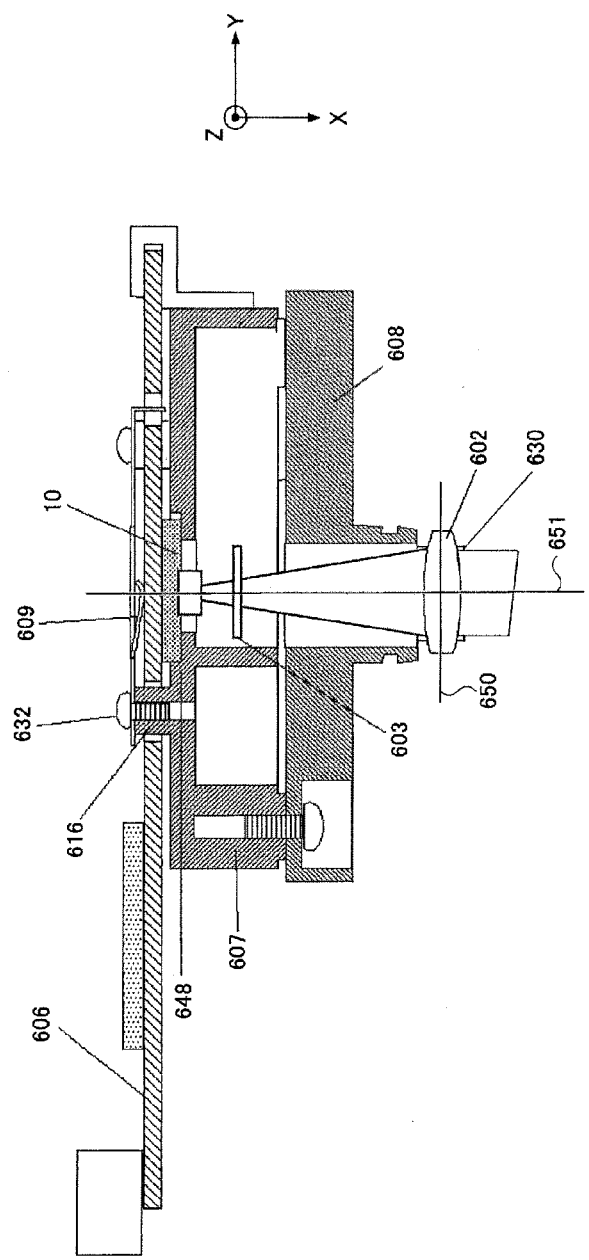
FIG. 18 is an illustration diagram of an optical unit in a first embodiment.
Figure 19:
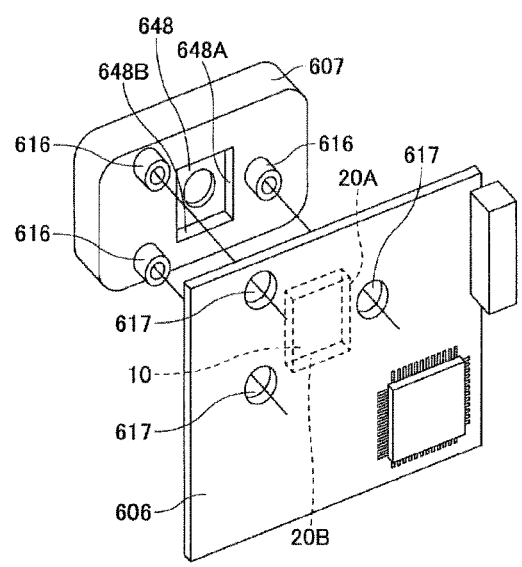
FIG. 19 is a configuration diagram (3) of an optical unit in a first embodiment.

Furthermore, as illustrated in FIG. 18, the coupling lens 602 is fixed by filling a gap between a peripheral surface part thereof and a cylindrical face 630 formed on the holder member 608 with an adhesive agent, and in order to adjust a degree of parallelization between a plane orthogonal to an optical axis 651 of the coupling lens 602 and an array face of the surface-emitting laser array in the above-mentioned surface-emitting laser module 10, the surface-emitting laser array in the surface-emitting laser module 10 is mounted so as to cause a front face side thereof to impinge on a contact face 648 (wherein the contact face 648 is preliminarily designed to be parallel with a plane 650 orthogonal to the optical axis 651 of the coupling lens 602). Thereby, it may be possible to determine a position in a direction of an optical axis and cause a direction of emission of a light beam to be orthogonal to the contact face 648.

Additionally, reference numerals 611, 624, 625, 626, 627, 631, 632, and 633 indicate a bracket member, a positioning pin, an arm part, an adjustment screw, a spring, a positioning hole, a screw, and a reinforcement member, respectively.

Furthermore, in the optical unit in the present embodiment, a cylindrical part of the holder member 608 is inserted into a fitting hole 634 provided on the bracket member 611, is rotatably supported in a plane orthogonal to the optical axis 651 by engaging a locking claw 629 of a plate spring 612 with a groove on the cylindrical part, and is fixed on a housing which supports a polygon mirror or a fθ lens as described below and is not illustrated in the figures.

In the optical unit in the present embodiment, the control board 606 is supported by the base member 607 on a condition that the surface-emitting laser module 10 placed on the control board 606 impinges on the contact face 648 provided on the base member 607. Herein, adjacent contact faces 648A and 648B are provided on a concave portion on which the contact face 648 provided on the base member 607 is formed, and support is conducted by contacting the contact faces 648A and 648B with the contact side faces 20A and 20B which contact the contact faces 60A and 60B of the jig for manufacturing 60 during manufacturing, among side face portions of the ceramic package 20 in the surface-emitting laser module 10.

Second Embodiment

Next, a second embodiment will be described. The present embodiment is a multi-beam scanning device and image forming apparatus using a multi-beam light source device having an optical unit in the first embodiment.

Figure 20:
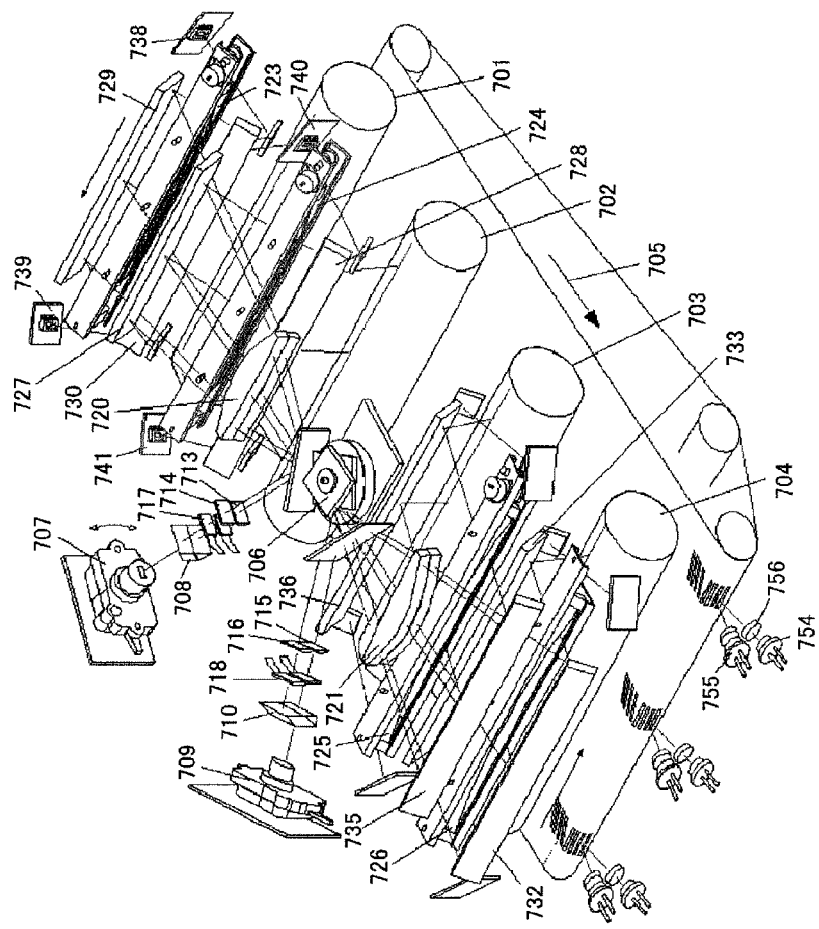
FIG. 20 is a configuration diagram (1) of a multi-beam scanning device in a second embodiment.

A multi-beam scanning device in the present embodiment will be described based on FIG. 20. Such a multi-beam scanning device is an optical scanning device for four-station scanning. A configuration of an integrated optical scanning unit is illustrated in which scanning with plural light beams corresponding to four stations from a multi-beam light source device is conducted by a single polygon mirror so that deflection and scanning are conducted in opposite directions to scan each photoconductor drum.

Four photoconductor drums 701, 702, 703, and 704 are arranged at equal intervals along a direction of movement of a transfer body 705, and transfer and superpose toner images with different colors sequentially to form a color image. As illustrated in the figure, optical scanning devices for scanning respective photoconductor drums are configured integrally and scanning with respective light beams is conducted by a polygon mirror 706 configured to be two tiers.

Two multi-beam light source devices 707 and 709 are arranged for every two stations for scanning in an identical direction, and provide light beams divided for two or upper and lower tiers corresponding to upper and lower faces of the above-mentioned polygon mirror 706 by using light beam dividing prisms 708 and 710 so as to form an image corresponding to each station on each photoconductor drum alternately.

The multi-beam light source devices 707 and 709, and a fθ lens and a toroidal lens which compose an imaging optical system are arranged symmetrically with respect to a symmetrical plane which includes a rotation axis of the polygon mirror 706 and is parallel to a photoconductor drum axis, and a light beam from each multi-beam light source device is deflected toward opposing directions by the polygon mirror 706 to be guided to each photoconductor drum.

Therefore, an electrostatic image is written by providing a scanning direction on each station so as to be opposing directions for respective opposing photoconductor drums, adjusting a width of a recording area, in other words, a magnification in a main-scanning direction, and matching one scanning start edge and another scanning end edge.

Additionally, liquid crystal deflection elements 717 and 718 deflect only a polarization component matching a direction of orientation of a liquid crystal, and hence, a polarization direction of a light-emitting source is aligned in one direction.

Figure 16:
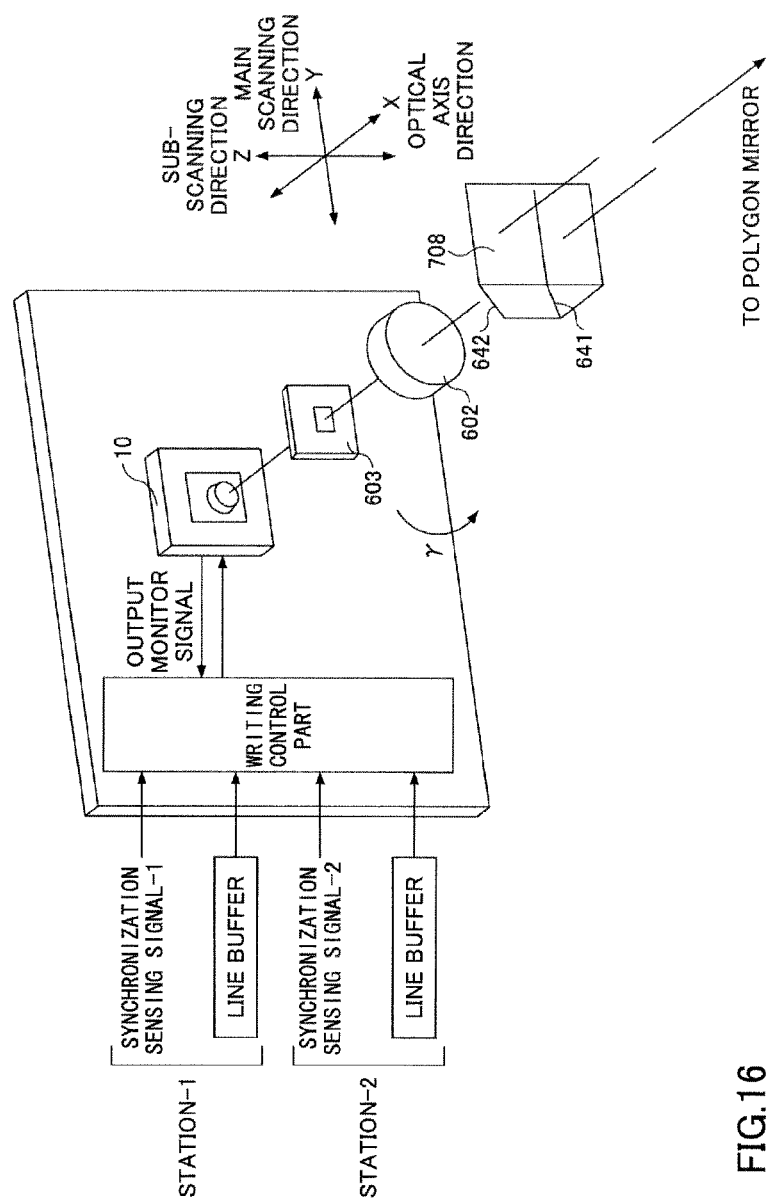
FIG. 16 is a configuration diagram (1) of an optical unit in a first embodiment.
Figure 17:
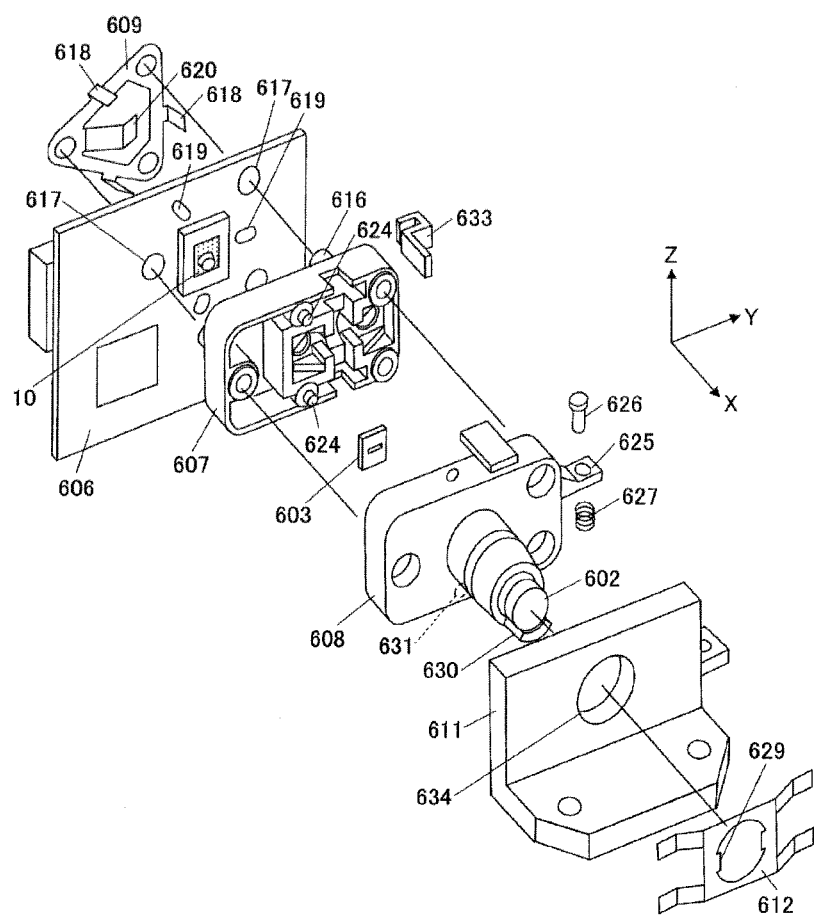
FIG. 17 is a configuration diagram (2) of an optical unit in a first embodiment.

As illustrated in FIG. 16, the light beam dividing prism 708 has a half mirror face 641 and a mirror face 642 parallel to the half mirror face, and plural beams 771 are emitted from the multi-beam light source device 707 in such a manner that each half mirror face reflects a half of an amount of light and transmits a remaining half, so as to be divided into two or upper and lower ones and match directions thereof, thereby having a predetermined space in a sub-scanning direction.

The liquid crystal deflection element 717 is arranged at each of upper and lower portions of en emission face of the light beam dividing prism 708, wherein, when a voltage is applied thereto, it may be possible to produce an electric potential distribution in a sub-scanning direction to change orientation of a liquid crystal, generate a refractive index distribution, and incline a direction of a light ray, so that it may be possible to change a scanning position on a photoconductor drum surface depending on an applied voltage.

Cylindrical lenses 713 and 714 are provided on two tiers corresponding to respective divided light beams, wherein one of them is attached to be capable of adjusting a rotation centered at an optical axis and be capable of adjusting respective focal lines to be parallel, thereby being incident on each of two tiers configured for the polygon mirror 706 at an interval of 6 mm in a sub-scanning direction.

The cylindrical lenses 713 and 714 have positive curvatures, at least, in a sub-scanning direction, and a beam is once converged on a polygon mirror surface, thereby providing, together with a toroidal lens described below, a face tangle error correction optical system in which a deflection point and a photoconductor surface are provided in a conjugate relation in a sub-scanning direction.

The polygon mirror 706 has four faces, and plural beams from each sequence of light-emitting points are collectively deflected by an identical deflection face for scanning. Phases of upper and lower polygon mirrors are shifted by 45° so that scanning with a light beam is conducted by upper and lower tiers alternately.

The imaging optical system is composed of a fθ lens and a toroidal lens, any of which is provided by plastic molding, wherein a fθ lens 720 has a non-circular arc shape having a power in such a manner that a beam moves on a photoconductor surface at a constant velocity in a main scanning direction with rotation of the polygon mirror 706, and is integrally configured to be stacked in two layered tiers.

Each scanning beam passing through a toroidal lens is incident on light sensing sensors 738 and 740 arranged at a side of scanning start edge and light sensing sensors 739 and 741 arranged at a side of scanning end edge, wherein a synchronization sensing signal is produced for each light-emitting source based on detection signals form the light sensing sensors 738 and 740 to provide timing of writing start.

On the other hand, detection signals from the light sensing sensors 739 and 741 arranged at a side of scanning end edge correct a deviation of a magnification in a main scanning direction by measuring a difference between detection times of respective light beams from the light sensing sensors 738 and 740 arranged at a side of scanning start edge, conducting comparison with a predetermined reference value, and changing a pixel clock for modulating each light-emitting source, as described below.

Figure 21:
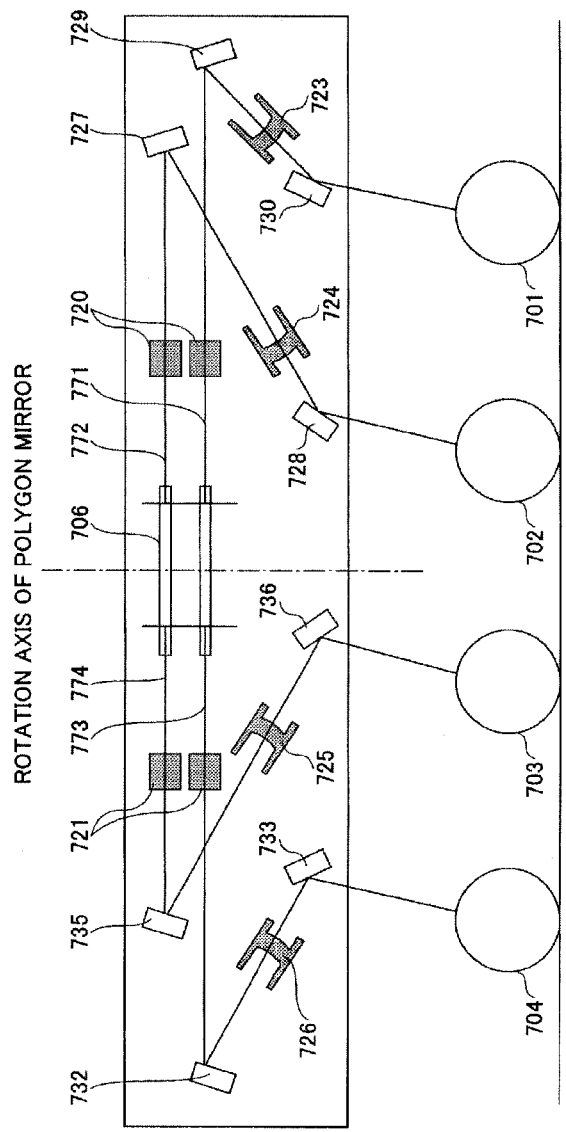
FIG. 21 is a configuration diagram (2) of a multi-beam scanning device in a second embodiment.

Furthermore, a path of a light ray in a sub-scanning cross-section will be described in conjunction with FIG. 21.

Plural light-emitting sources are arranged symmetrically with respect to an optical axis of the coupling lens, and each of light rays converted into parallel light beams by the coupling lens emits from the multi-beam light source device 707, subsequently is once converged near a back focus of the coupling lens, broadening a light ray space and being incident on the fθ lens 720 in a main scanning direction, and is again converged near a deflection face of the polygon mirror by the cylindrical lenses 713 and 714 and being incident on the fθ lens 720 in a sub-scanning direction.

Furthermore, plural light beams from the multi-beam light source device 707 are divided into two portions or upper and lower portions in a sub-scanning direction by the light beam dividing prism 708 to be guided to a photoconductor drum corresponding to each station, as described above.

Beams 771 for scanning emitted through a lower tier of the light beam dividing prism 708 from plural light-emitting sources are deflected at a lower tier of the polygon mirror 706 through the cylindrical lens 713, pass through a lower tier of the fθ lens 720, are caused to be incident on a toroidal lens 723 by a folding mirror 729, are imaged into a spot shape on the photoconductor drum 710 through a folding mirror 730, and form a latent image corresponding to image information for yellow color as a first image forming station.

Beams 772 for scanning emitted through an upper tier of the light beam dividing prism 708 from plural light-emitting sources are deflected at an upper tier of the polygon mirror 706 through the cylindrical lens 714, pass through an upper tier of the fθ lens 720, are caused to be incident on a toroidal lens 724 by a folding mirror 727, are imaged into a spot shape on the photoconductor drum 702 through a folding mirror 728, and form a latent image corresponding to image information for magenta color as a second image forming station.

Similarly, plural light beams from the multi-beam light source device 709 in a corresponding station are also divided into two portions or upper and lower portions by the light beam dividing prism 710 and guided to a photoconductor drum corresponding to each station through a liquid crystal deflection element 718.

Beams 773 for scanning emitted through a lower tier of the light beam dividing prism 710 from plural light-emitting sources are deflected at a lower tier of the polygon mirror 706 through the cylindrical lens 715, pass through a lower tier of the fθ lens 721, are caused to be incident on a toroidal lens 726 by a folding mirror 732, are imaged into a spot shape on the photoconductor drum 704 through a folding mirror 733, and form a latent image corresponding to image information for black color as a fourth image forming station, while beams 774 for scanning emitted through an upper tier of the light beam dividing prism 710 from plural light-emitting sources are deflected at an upper tier of the polygon mirror 705 through the cylindrical lens 716, pass through an upper tier of the fθ lens 721, are caused to be incident on a toroidal lens 725 by a folding mirror 735, are imaged into a spot shape on the photoconductor drum 703 through a folding mirror 736, and form a latent image corresponding to image information for cyan color as a third image forming station.

Additionally, the present embodiment has a part for detecting a detection pattern of a toner image. A part for detecting a detection pattern of a toner image is composed of an LED element for illumination 754, a photo-sensor 755 for receiving reflected light, and a pair of condenser lenses 756, wherein a line pattern inclined by about 45° with respect to a main scanning line is formed and a detection time difference is read with movement of a transfer belt. In the present embodiment, arrangement is conducted at three locations, such as a central part and both left and right edge parts in the present practical example, so that an inclination and each magnification from a center to left and right edges are detected by a difference between both left and right edge parts and corrected so as to match a reference station. In other words, it is preferable for a position of a beam spot to be held stably for a long period of time.

Figure 22:
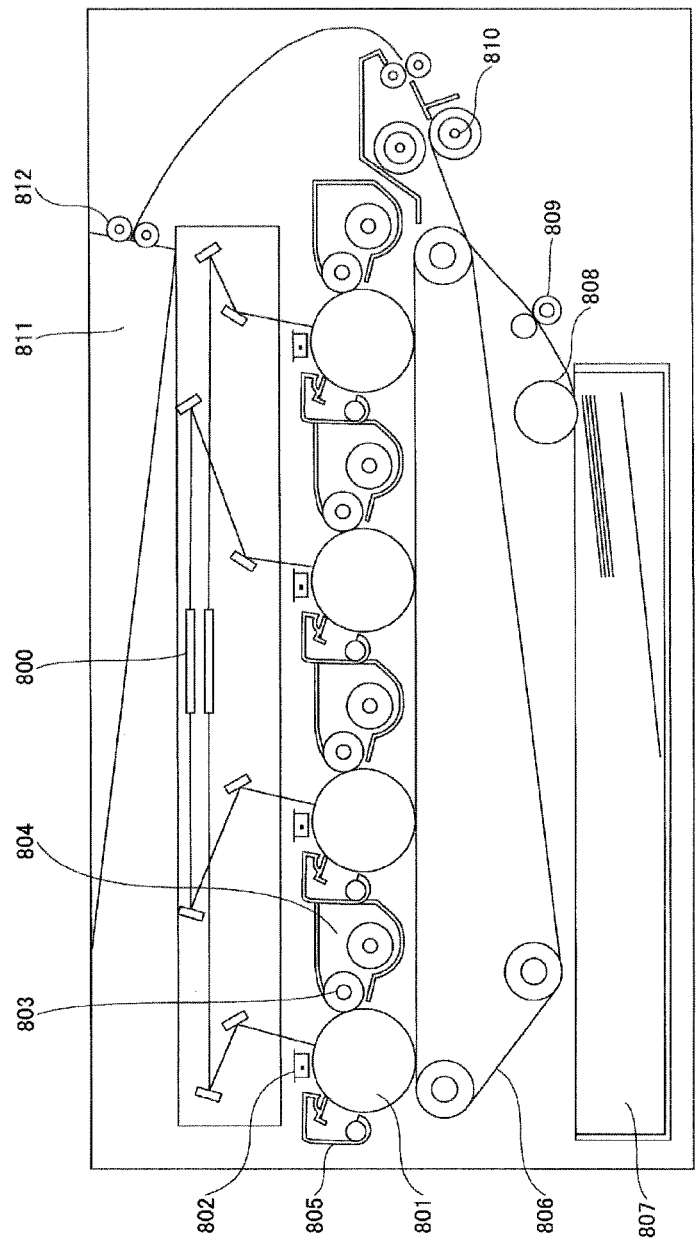
FIG. 22 is a configuration diagram of an image forming apparatus in a second embodiment.

Next, an image forming apparatus in the present embodiment will be described based on FIG. 22.

In an image forming apparatus in the present embodiment, an electrically charging charger 802 for electrically charging a photoconductor at a high voltage, a development roller 803 for attaching an electrically charged toner to an electrostatic latent image recorded by an optical scanning device 800 in the present embodiment so as to develop such an image, a toner cartridge 804 for supplying a toner to the development roller, and a cleaning case 805 for scraping and storing a toner remaining on the drum are arranged around a photoconductor drum 801. As described above, image recording onto the photoconductor drum is simultaneously conducted for plural, lines, in the practical example, four lines, by scanning due to each face of a polygon mirror.

The above-mentioned image forming stations are juxtaposed in a direction of movement of a transfer belt 806, wherein yellow, magenta, cyan, and black toner images are sequentially transferred onto and superposed on the transfer belt on matched timing so as to form a color image.

Respective image forming stations have an identical configuration basically except that toner colors are different.

On the other hand, while a recording paper sheet is fed from a paper feeding tray 807 by a paper feeding control roller 808 and sent by a paper stop roller pair 809 at a matched timing of recording start in a sub-scanning direction, a color image is transferred from the transfer belt and fixed by a fixation roller 810 and ejection to an ejected paper tray 811 is conducted by an ejected paper roller 812.

Because the image forming apparatus in the present embodiment uses the optical unit in the first embodiment, it may be possible to obtain an image with a high reliability at a low cost.

Although some embodiments of the present invention have been described above, a content(s) of an embodiment of the invention is/are not limited by the above-mentioned content(s).

APPENDIX

An Illustrative Embodiment(s) of a Method for Manufacturing an Optical Unit, an Optical Unit, an Optical Scanning Device, and an Image Forming Apparatus At least one illustrative embodiment of the present invention may relate to a method for manufacturing an optical unit, an optical unit, an optical scanning device, and an image forming apparatus.

An object of at least one illustrative embodiment of the present invention may be to provide a method for manufacturing an optical unit in which plural light-emitting or light-receiving elements are placed in a ceramic package, wherein the optical unit has a high reliability and is capable of being manufactured at a high yield, and such an optical unit.

At least one illustrative embodiment of the present invention may be a method for manufacturing an optical unit having an optical module in which plural light-receiving and light-emitting elements are placed in a ceramic package, which is characterized by having a step of bringing two side face portions among side face portions of the ceramic package into contact with two contact portions of a jig for manufacturing, respectively, a step of placing the plural light-receiving and light-emitting elements in a predetermined region of the ceramic package with reference to the contact portions of the jig for manufacturing, and a step of connect the plural light-receiving and light-emitting elements and a wiring line part formed in the ceramic package by a bonding wire, wherein between either one of the two contact portions and one of the plural light-receiving and light-emitting elements in the step of placing the plural light-receiving and light-emitting elements, (an)other one(s) of the plural light-receiving and light-emitting elements is/are arranged.

At least one illustrative embodiment of the present invention may also be an optical unit characterized by having a ceramic package, plural light-receiving and light-emitting elements placed in such a manner that two side face portions among side face portions of the ceramic package are brought into contact with two contact portions of a jig for manufacturing, respectively, and a bonding wire for connecting the light-receiving and light-emitting elements and a wiring line part formed in the ceramic package, wherein, between either one of the two contact portions and one of the plural light-receiving and light-emitting elements, (an)other one(s) of the plural light-receiving and light-emitting elements is/are placed, on a condition that the two side face portions of the ceramic package are brought into contact with the contact portions of the jig for manufacturing, and wherein the two side face portions among the side face portions of the ceramic package which contact the two contact portions of the jig for manufacturing contact two predetermined contact faces of the optical unit.

Illustrative embodiment (1) is a method for manufacturing an optical unit having an optical module in which plural light-receiving and light-emitting elements are placed in a ceramic package, wherein the method for manufacturing an optical unit is characterized by having a step of bringing two side face portions among side face portions of the ceramic package into contact with two contact portions of a jig for manufacturing, respectively, a step of placing the plural light-receiving and light-emitting elements in a predetermined region of the ceramic package with reference to the contact portions of the jig for manufacturing, and a step of connecting the plural light-receiving and light-emitting elements and a wiring line part formed in the ceramic package by a bonding wire, wherein between either one of the two contact portions and one of the plural light-receiving and light-emitting elements in the step of placing the plural light-receiving and light-emitting elements, (an)other one(s) of the plural light-receiving and light-emitting elements is/are placed.

Illustrative embodiment (2) is the method for manufacturing an optical unit as described in illustrative embodiment (1), characterized in that the plural light-receiving and light-emitting elements have a light-emitting element and a light-receiving element, and in the step of placing the plural light-receiving and light-emitting elements the light-receiving element is placed between either one of the two contact portions and the light-emitting element.

Illustrative embodiment (3) is the method for manufacturing an optical unit as described in illustrative embodiment (1) or (2), characterized in that a transparent plate material is placed at a side of light-receiving and light-emitting faces of the light-receiving and light-emitting elements with reference to the contact portions of the jig for manufacturing after the step of connecting by the bonding wire.

Illustrative embodiment (4) is the method for manufacturing an optical unit as described in any of illustrative embodiments (1) to (3), characterized in that the two side face portions of the ceramic package which contact the two contact portions of the jig for manufacturing are brought into contact with two predetermined contact faces of the optical unit to place the ceramic package therein.

Illustrative embodiment (5) is the method for manufacturing an optical unit as described in any of illustrative embodiments (1) to (4), characterized in that the ceramic package is fabricated by dividing formed plural ceramic packages thereinto.

Illustrative embodiment (6) is the method for manufacturing an optical unit as described in any of illustrative embodiments (1) to (3), characterized in that the ceramic package is generally square or generally rectangular and the two side face portions of the ceramic package which contact the contact portions of the jig for manufacturing are adjacent thereto.

Illustrative embodiment (7) is an optical unit characterized by having a ceramic package, plural light-receiving and light-emitting elements placed in such a manner that two side face portions among side face portions of the ceramic package are brought into contact with two contact portions of a jig for manufacturing, respectively, and a bonding wire for connecting the light-receiving and light-emitting elements and a wiring line part formed in the ceramic package, wherein, between either one of the two contact portions and one of the plural light-receiving and light-emitting elements, (an)other one(s) of the plural light-receiving and light-emitting elements is/are placed, on a condition that the two side face portions of the ceramic package are brought into contact with the contact portions of the jig for manufacturing, and wherein the two side face portions among the side face portions of the ceramic package which contact the two contact portions of the jig for manufacturing contact two predetermined contact faces of the optical unit.

Illustrative embodiment (8) is the optical unit as described in illustrative embodiment (7), characterized in that the plural light-receiving and light-emitting elements have a light-emitting element and a light-receiving element and the light-receiving element is placed between either one of the two contact portions and the light-emitting element.

Illustrative embodiment (9) is an optical scanning device for scanning a face to be scanned with light, wherein the optical scanning device is characterized by having a light source having a surface-emitting laser module as described in illustrative embodiment (7) or (8), a light deflecting part for deflecting light from the light source, and an optical scanning system for converging light deflected by the light deflecting part onto the face to be scanned.

Illustrative embodiment (10) is an image forming apparatus characterized by having an image carrier and the optical scanning device as described in illustrative embodiment (9) for scanning the image carrier with light modulated depending on image information.

According to at least one illustrative embodiment of the present invention, it may be possible to manufacture an optical unit in which plural light-emitting or light-receiving elements are placed in a ceramic package, wherein the optical unit may have a high reliability and a high yield.

Although the illustrative embodiment(s) and specific example(s) of the present invention have been described with reference to the accompanying drawings, the present invention is not limited to any of the illustrative embodiment (s) and specific example(s) and the illustrative embodiment (s) and specific example(s) may be altered, modified, or combined without departing from the scope of the present invention.

The present application claims the benefit of priority based on Japanese Patent Application No. 2011-277820 filed on Dec. 20, 2011, the entire content of which is hereby incorporated by reference herein.

What is claimed is:

1. A method for manufacturing an optical unit, comprising:
   a step of (a) bringing two side face portions of a ceramic package into contact with two contact portions of a jig;
   a step of (b) placing, in a predetermined region of the ceramic package, plural light-receiving and light-emitting elements at respective predetermined positions relative to, and with reference to, the contact portions of the jig that are in contact with the two side face portions of the ceramic package;
   a step of (c) connecting the plural light-receiving and light-emitting elements to a wiring line part formed in the ceramic package by using a bonding wire; and a step of (d) placing a frame having a transparent cover glass on a top surface of the ceramic package with reference to the contact portions of the jig, wherein the cover glass is obliquely disposed relative to the top surface of the ceramic package, wherein at least one of the plural light-receiving and light-emitting elements is placed between one of the two contact portions of the jig and another one of the plural light-receiving and light-emitting elements in the step of placing the plural light-receiving and light-emitting elements, wherein a light-receiving element, as placed in the step of (b), amongst the plural light-receiving and light-emitting elements is disposed at a side surface side of the ceramic package, between (i) the wiring line part formed in the ceramic package and (ii) a side face portion amongst the side face portions of the ceramic package which is in contact with the jig.

2. The method for manufacturing an optical unit as claimed in claim 1, wherein the plural light-receiving and light-emitting elements include a light-emitting element and a light-receiving element, and the light-receiving element is placed between one of the two contact portions of the jig and the light-emitting element in the step of placing the plural light-receiving and light-emitting elements.

3. The method for manufacturing an optical unit as claimed in claim 1, further comprising a step of placing a transparent plate at a side of light-receiving and light-emitting faces of the light-receiving and light-emitting elements with reference to the contact portions of the jig.

4. The method for manufacturing an optical unit as claimed in claim 1, wherein the two side face portions of the ceramic package contacting the two contact portions of the jig are brought into contact with two predetermined contact faces of the optical unit.

5. The method for manufacturing an optical unit as claimed in claim 1, wherein the ceramic package is fabricated by dividing plural ceramic packages thereinto.

6. The method for manufacturing an optical unit as claimed in claim 1, wherein the ceramic package is generally square or generally rectangular and the two side face portions of the ceramic package contacting the contact portions of the jig are adjacent thereto.

* * * * *